United States Patent
Matsushita et al.

(10) Patent No.: US 6,624,050 B2
(45) Date of Patent: Sep. 23, 2003

(54) METHOD OF MANUFACTURING SEMICONDUCTOR DEVICE

(75) Inventors: Takeshi Matsushita, Kanagawa (JP); Shuzo Ohara, Osaka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/800,879

(22) Filed: Mar. 7, 2001

(65) Prior Publication Data

US 2001/0007262 A1 Jul. 12, 2001

Related U.S. Application Data (62) Division of application No. 09/419,936, filed on Oct. 18, 1999, now Pat. No. 6,222,118.

(30) Foreign Application Priority Data

Oct. 21, 1998 (JP) .............................. 10-300113

(51) Int. Cl.[7] .................... H01L 21/20; H01L 21/36
(52) U.S. Cl. .................. 438/478; 438/455; 438/458; 438/64
(58) Field of Search ........................... 438/455, 458, 438/459, 149, 616, 960, 478

(56) References Cited

U.S. PATENT DOCUMENTS

| 4,640,583 A | * | 2/1987 | Hoshikawa et al. | 350/343 |
|---|---|---|---|---|
| 4,683,147 A | | 7/1987 | Eguchi et al. | 427/54.1 |
| 5,391,257 A | * | 2/1995 | Sullivan et al. | 156/630 |
| 5,681,402 A | * | 10/1997 | Ichinose et al. | 136/256 |
| 6,100,166 A | * | 8/2000 | Sakaguchi et al. | 438/455 |
| 6,190,937 B1 | * | 2/2001 | Nakagawa et al. | 438/67 |
| 6,194,239 B1 | * | 2/2001 | Tayanaka | 438/28 |

FOREIGN PATENT DOCUMENTS

JP 409018042 A * 1/1997

* cited by examiner

*Primary Examiner*—John F. Niebling
*Assistant Examiner*—Angel Roman
(74) *Attorney, Agent, or Firm*—Sonnenschein, Nath & Rosenthal LLP (57) ABSTRACT

A plurality of solar batteries are provided between a first substrate and a second substrate. The first substrate and the second substrate are formed of, for example, a paper or a non-woven cloth, which is a material including a natural fiber, cellulose, as the main component. Papers and silicon have relatively small difference in coefficient of thermal expansion so that warp caused by changes in the temperature is suppressed. Also, papers are light, easy to be processed and spontaneously decomposed so that disposing becomes easy. The first substrate is preferable to be transparent or semitransparent and preferable to be formed of cellophane paper, glassine paper, parchment paper, or Japanese paper. Oil may be included in the material. The second substrate is preferable to be opaque. A waterproof film may be formed on the first substrate and the second substrate.

19 Claims, 5 Drawing Sheets

METHOD OF MANUFACTURING SEMICONDUCTOR DEVICE

RELATED APPLICATION DATA

This application is a divisional of application Ser. No. 09/419,936, filed Oct. 18, 1999, now U.S. Pat. No. 6,222,118. The present and foregoing applications claim priority to Japanese Application No. P10-300113, filed Oct. 21, 1998. All of the foregoing applications are incorporated herein by reference to the extent permitted by law.

BACKGROUND OF THE INVENTION

1. Field of the Invention

The present invention relates to a semiconductor device comprising thin film semiconductor layers such as a solar battery and a method of manufacturing the same. Specifically, it relates to a semiconductor device manufactured through forming thin film semiconductor layers on a provisional substrate and then transcribing it on another substrate, and a method of manufacturing the same.

2. Description of the Related Art

In recent years, solar batteries have come to be in practical use. It is necessary to save resources and to decrease costs to utilize solar batteries in full-scale. Thin film solar batteries are preferred to thick film solar batteries when energy conversion (light-electricity) efficiency and shortening the cycle of energy recycle are taken into consideration.

The same applicants as this application have first proposed a method of separating an element formation layer from a substrate (Japanese Patent Application laid-open Hei 8-213645). In the method, a porous layer is formed on a single crystalline substrate as an isolation layer and a semiconductor layer to be a solar battery is grown on the porous layer. Then, a plastic plate or a glass plate is adhered onto the semiconductor layer using an adhesive, and the semiconductor layer is exfoliated from the single crystal substrate together with the plastic plate or the glass plate by applying tensile stress.

As described, a thin film solar battery of the related art is manufactured by transcribing it onto a plastic plate or a glass plate. As a result, warp is generated because of the difference in thermal expansion of the solar battery and the plastic plate, resulting in the destruction of the solar battery. Also, a glass plate is difficult to be applied depending on its usage since it is hard to be folded or to be cut.

Furthermore, as the plastic plate and the glass plate are not spontaneously decomposed, the solar battery which becomes unusable must be artificially decomposed when being disposed. Therefore, there is a problem of waste disposal such as running cost of decomposing, if solar batteries becomes widespread use in full-scale, and if there are a large amount of the solar batteries which are unusable.

SUMMARY OF THE INVENTION

The invention has been designed to overcome the forgoing problems. The object is to provide a semiconductor device in which warp is suppressed and processing and disposing can be easily performed, and a method of manufacturing the same.

A semiconductor device of the invention comprises: thin film semiconductor layers having one side and the other side facing each other; and a first substrate made of a material including cellulose which is positioned on the one side.

A method of manufacturing a semiconductor device of the invention includes the steps of: depositing thin film semiconductor layers on a provisional substrate; exfoliating the thin film semiconductor layers from the provisional substrate; and transcribing the thin film semiconductor layers onto the first substrate.

In the semiconductor device of the invention, the first substrate is formed of a material containing cellulose. Therefore, the difference in thermal expansion of the first substrate and the thin film semiconductor layers is decreased and warp caused by changes in temperature is suppressed. Also, the semiconductor device becomes light and processing becomes easy. Furthermore, the thin film semiconductor layer can be spontaneously decomposed so that disposal becomes easy.

In the method of manufacturing a semiconductor device of the invention, after thin film semiconductor layers are deposited on a provisional substrate, the thin film semiconductor layers are exfoliated from the provisional substrate; and the thin film semiconductor layers are transcribed onto the first substrate.

Other and further objects, features and advantages of the invention will appear more fully from the following descriptions.

DESCRIPTION OF THE PREFERRED EMBODIMENTS

Examples of the invention will be described in the followings with reference to the drawings.

FIRST EXAMPLE

Figure 1:
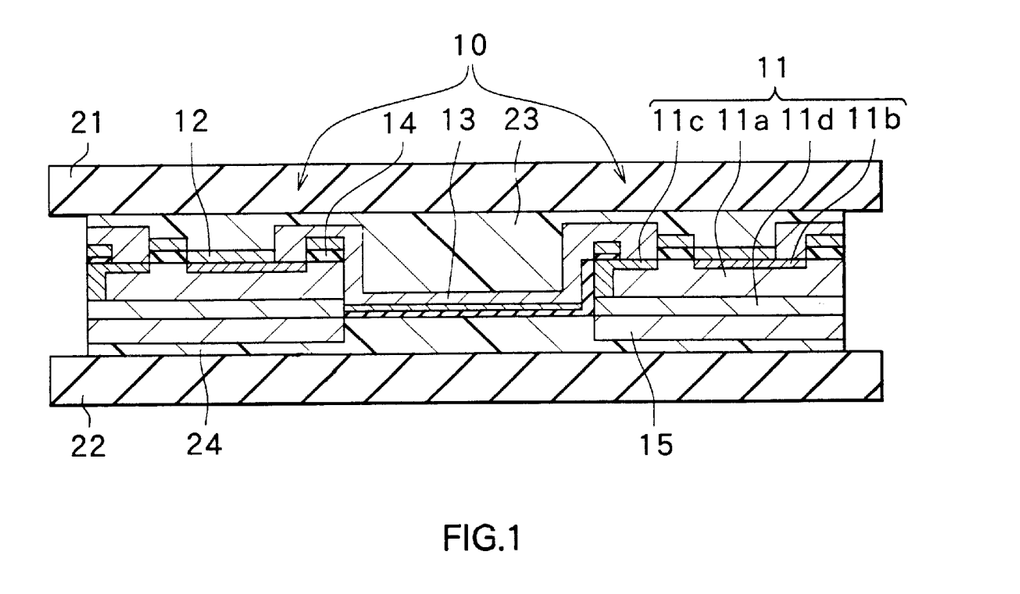
FIG. 1 is a cross section showing the configuration of a semiconductor device according to a first example of the invention.

FIG. 1 shows the configuration of a semiconductor device according to a first example of the invention. The semiconductor device comprises a plurality of solar batteries 10, which are thin film semiconductor layers, provided with a space in between each of them. FIG. 1 shows two of the solar batteries. The solar batteries 10 have one side and the other side facing each other. A first substrate 21 for both of the solar batteries 10 is extendedly formed on one side and a second substrate 22 for both is extendedly formed on the other side, respectively. The solar batteries 10 and the first substrate 21 are adhered by an adhesive layer 23 while the solar battery and the second substrate 22 are adhered by an adhesive layer 24. The adhesive layers 23 and 24 are made of ethylene vinyl acetate (EVA), phloro plastic (THV) or the like.

Each of the solar batteries 10 has the same configuration, comprising a semiconductor layer 11 of about 1 to 50 μm in thickness made of single crystalline silicon. Each of p-type regions 11a of 1 to 49 μm in thickness including p-type impurity such as boron (B) $1\times10^{15}$ to $1\times10^{18}/cm^3$ is provided in each of the semiconductor layers 11.

Each of n$^+$-type regions 11b of about 0.2 μm, for example, in thickness, including n-type impurities such as phosphorus (P) with high concentration such as $1\times10^{19}/cm^3$, is provided on one side (that is, the first substrate 21 side) adjacent to each of the p-type regions 11a. Furthermore, each of p$^+$-type regions 11c of about 1 μm, for example, in thickness including p-type impurity such as boron with high concentration such as $1\times10^{19}/cm^3$, is provided on one side of each of the p-type regions 11a. Each of the n$^+$-type regions 11b, which is cathode of the solar battery, and each of the p$^+$-type regions 11c, which is anode of the solar battery, are provided with a space in between in each of the semiconductor layers 11.

Each of p$^+$-type regions 11d of about 1 μm, for example, in thickness, including p-type impurities such as boron with high concentration such as $1\times10^{19}/cm^3$, is provided on the other side (that is, the second substrate 22 side) adjacent to each of the p-type regions 11a. The p$^+$-type regions 11d are for reflecting electron generated by light in the p-type regions 11c and for increasing light-electric conversion efficiency by decreasing recombination of electron and hole in the p$^+$-type regions 11d.

Each of the solar batteries 10 comprises a reflection-proof film 12 each provided on one side of each semiconductor layer 11. Each of the reflection-proof films 12 is formed of, for example, titanium oxide (TiO$_2$) of about 60 nm in thickness and prevent light from being reflected from the surface (especially, the surface of each of n$^+$-type regions 11b) of each semiconductor layer 11. An opening is formed in each of the reflection-proof films 12 corresponding to each of the n$^+$-type regions 11b, and each of metallic electrodes 13 made of aluminum (Al), for example, is electrically connected to each of the n$^+$-type regions 11b through each opening.

Each of the metallic electrodes 13 is extended to a neighboring solar battery 10, respectively, and is electrically connected to each of the p$^+$-type regions 11c through the opening formed on each reflection-proof film 12. In other words, each of the metallic electrodes 13 connects two neighboring solar batteries 10 in series. An oxidation film 14 is formed in between each metallic electrode 13 and each semiconductor layer 11, respectively. Each of the metallic electrodes 13 is electrically connected to each of the n$^+$-type regions 11b and each of the p$^+$-type regions 11c, respectively, through each opening formed on the oxidation film 14.

Each of the solar batteries 10 further comprises a reverse-side electrode 15 provided adjacent to the other side of each of p$^+$-type regions 11d. Each of the reverse-side electrodes 15 is formed of aluminum, for example, and decreases series resistance of each solar battery 10 while reflecting the light permeated through the semiconductor layer 11.

The first substrate 21 and the second substrate 22 have a thickness of about 100 μm, for example, and are made of at least paper or non-woven cloth, for example, which includes a natural fiber, cellulose, as the main component. It is preferable that the first substrate 21 is transparent or semi-transparent in order to increase permeation rate of light. This means, it is preferable that the first substrate 21 is formed of at least one kind of paper selected from the group of cellophane paper, glassine paper, parchment paper (paper which is made of chemical pulp and is processed by sulfuric acid solution), and Japanese paper such as shoji paper, for example. Paper or non-woven cloth including oil are also preferable as the material for the first substrate 21 since they have high permeation rate. On the other hand, it is preferable that the second substrate 22 is opaque, highly lustrous and white in order to increase the reflection rate of light.

There is a case where at least part of the surfaces of the first substrate 21 and the second substrate 22 have patterns of illustrations or letters, which can be marks for distinguishing or can add the beauty when they are in use. The patterns may be formed by making concavo-convex area on the surface or may be formed by printing.

Such semiconductor device can be manufactured as follows.

Figure 2A:
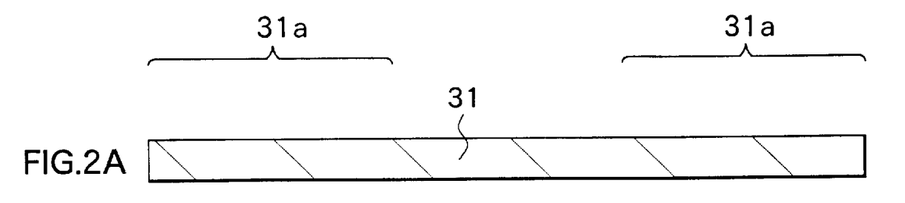
FIGS. 2A, 2B, 2C and 2D are cross sections showing each manufacturing step of the semiconductor device shown in FIG. 1.
Figure 2B:
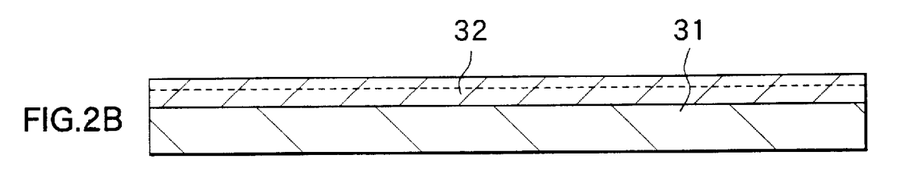

FIGS. 2A, 2B, 2C, 2D to FIGS. 4A, 4B show each manufacturing step. First, as shown in FIG. 2A, a provisional substrate 31 having, for example, a plurality of solar battery forming regions 31a is provided. The provisional substrate 31 is formed of single crystalline silicon having a specific resistance of about 0.01 to 0.02 Ω·cm to which p-type impurity such as boron is added. Next, as shown in FIG. 2B, a porous layer 32 is formed on the surface of the provisional substrate 31 by anodizing, for example.

Anodizing is a method of performing energizing using the provisional substrate 31 as anode in hydrofluoric acid solution. It can be performed by double-cell method, for example, disclosed in "'Anodizing of porous silicon' Surface Technology Vol.46 No.5 p8–13, 1995" by ITO and some others. In this method, a silicon substrate 31 on which a porous silicon layer 32 is formed is positioned in between two electrolytic solution cells, and a platinum electrode which is connected to the direct-current power supply is provided in each of both electrolytic solution cells. Then electrolytic solution is supplied to both of the electrolytic solution cells and direct-current voltage is applied to the platinum electrode. Thereby, the silicon substrate 31 becomes anode and the platinum electrode becomes cathode. As a result, one of the surface of the silicon substrate 31 is eroded and becomes porous.

At this time, a first porous layer with a low porous rate is formed by performing a first step of anodizing for eight minuets with current density of about, for example, 0.5 to 3.0 mA/cm$^2$ using, for example, electrolytic solution of HF (hydrogen fluoride): C$_2$H$_5$OH (ethanol)=1:1 as electrolytic solution (anodizing solution). Then, a second porous layer with medium porous rate is formed by performing a second step of anodizing for eight minutes with current density of about, for example, 3 to 20 mA/cm$^2$. A third porous layer with high porous rate is formed by performing a third step of anodizing for several seconds with current density of about, for example, 40 to 300 mA/cm$^2$. Incidentally, the third porous layer is the base for an isolation layer 32a (FIG. 2C) which is described later. Thereby, a porous layer 32 having a total thickness of about 8 μm is formed.

It is preferable that the provisional substrate 31 made of p-type single crystalline silicon is used since the porous silicon layer is formed thereon by anodizing. However, the substrate made of n-type single crystalline silicon or polycrystalline silicon may be used depending on the condition.

Figure 2C:
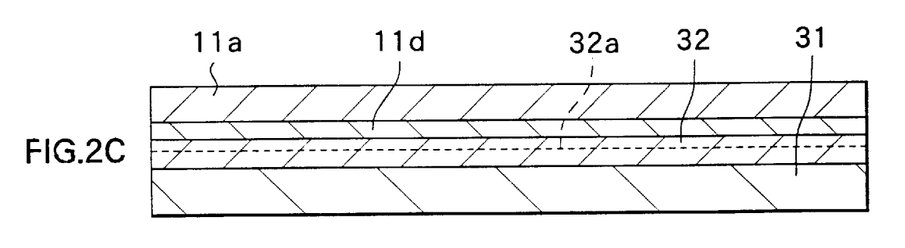

Then, each of the solar batteries 10 is formed on the porous layer 32. First, holes on the surface of the porous layer 32 are covered by performing hydrogen annealing for thirty minutes at, for example, 1100° C. Then, as shown in FIG. 2C, p$^+$-type regions 11d and p-type regions 11a, each of those made of single crystalline silicon are formed on, for example, the porous layer 32 in order by epitaxial growth using gas such as silane ($SiH_4$) at 1070° C.

While performing hydrogen annealing and epitaxial growth, atoms of silicon in the porous layer 32 are moved and rearranged. As a result, the portion of the porous layer 32, which has high porous rate further increases the porous rate and a layer with the least strength in tensile, that is, an isolation layer 32a is formed. However, the isolation layer 32a has sufficient tensile strength to an extent that the whole or a part of the $p^+$-type regions 11d and the p-type regions 11a do not exfoliate from the provisional substrate 31 when forming each of the solar batteries 10 on the porous layer 32.

Figure 2D:
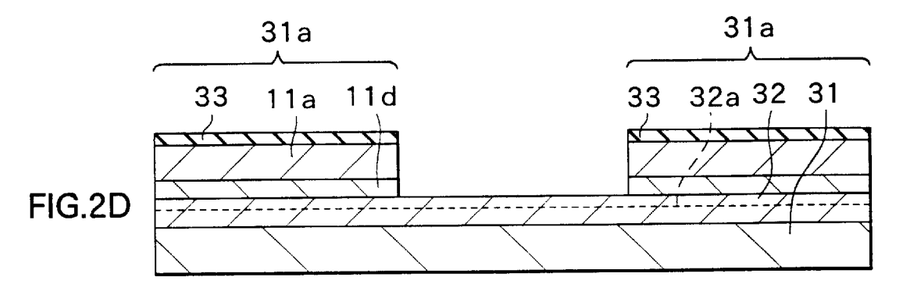

Next, as shown in FIG. 2D, an oxidation film 33 is selectively formed on the p-type regions 11a which corresponds to each of the solar battery forming regions 31a by CVD (Chemical Vapor Deposition) method. Then, the p-type regions 11a and the $p^+$-type regions 11d are selectively removed in order using, for example, alkaline etching solution such as potassium hydroxide (KOH) using the oxidation film 33 as a mask. Thereby, the p-type regions 11a and the $p^+$-type regions 11d are separated, respectively, in accordance with each of the solar battery forming regions 31a, and are separated to each of the solar batteries 10.

At this time, etching may be performed until the porous layer 32 in order to ensure the separation of each of the solar batteries 10. However, it is preferable that etching is not performed until the isolation layer 32a in order to exfoliate the solar batteries 10 easily from the provisional substrate 31 in the step to be described later.

Figure 3A:
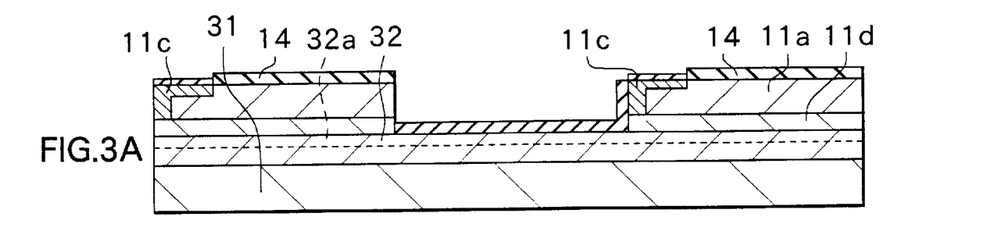
FIGS. 3A, 3B and 3C are cross sections showing each manufacturing step following the steps shown in FIGS. 2A, 2B, 2C and 2D.

After separating the p-type regions 11a and the $p^+$-type regions 11d, respectively, as shown in FIG. 3A, the oxidation film 33 is selectively removed in accordance with regions which each $p^+$-type region 11d is formed so that the surfaces of the corresponding p-type regions 11a are selectively exposed. Then, each $p^+$-type region 11c is formed by injecting p-type impurity such as boron with high concentration into each p-type regions 11a by, for example, ion implantation. After forming each of the $p^+$-type regions 11c, an oxidation film is formed thereon by CVD method or thermal oxidation. An oxidation film 14 is formed of this oxidation film and the oxidation film 33 formed earlier.

Figure 3B:
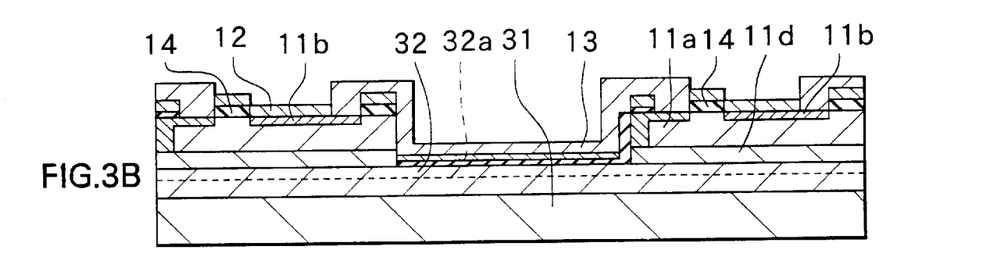

After forming the oxidation film 14, as shown in FIG. 3B, the oxidation film 14 is selectively removed in accordance with region which each $n^+$-type region 11b is formed so that the surfaces of the corresponding p-type regions 11a are selectively exposed. Then, $n^+$-type regions 11b are formed by injecting n-type impurity such as phosphorous with high concentration into each p-type region 11a by, for example, ion implantation. After forming each of the $n^+$-type regions 11b, a reflection-proof film 12 is formed all over the surface and an opening is selectively formed on the reflection-proof film 12 and the oxidation film 14, respectively, in accordance with each $n^+$-type region 11b and each $n^+$-type region 11c. Then, each of metallic electrodes 13 made of, for example, aluminum is selectively formed so as to, for example, connect each of the neighboring solar batteries in series.

Figure 3C:
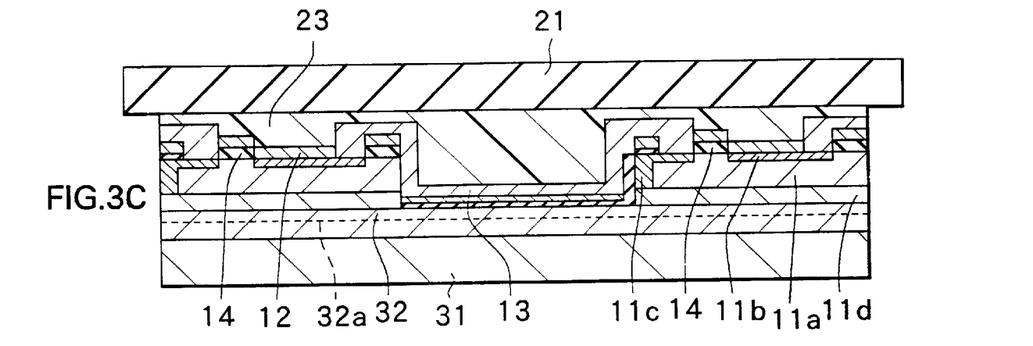

After forming each of the solar batteries 10, as shown in FIG. 3C, a first substrate 21 made of a material which includes cellulose as the main component is adhered onto one side of each solar battery 10 with the contact layer 23 in between.

Figure 4A:
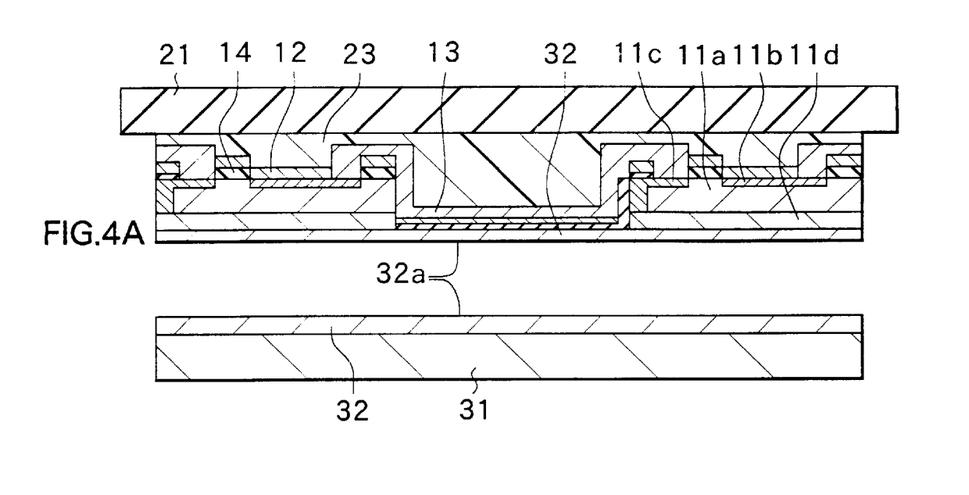
FIGS. 4A and 4B are cross sections showing each manufacturing step following the steps shown in FIGS. 3A, 3B and 3C.

After adhering the first substrate 21 as shown in FIG. 4A, each of the solar batteries 10 is exfoliated from the provisional substrate 31 together with the first substrate 21 in the isolation layer 32a, and is transcribed onto the first substrate 21, respectively. At the time of exfoliating the solar batteries 10, for example, one of, or a combination of two or three of the following three methods are used: one is a method of adding tensile stress onto the first substrate 21 and the provisional substrate 31; another is a method of soaking the provisional substrate 31 in water or solution of such as ethanol and decreasing the strength of the isolation layer 32a by irradiating supersonic; and the other is a method of decreasing the strength of the isolation layer 32a by adding centrifugal separation. In the method of irradiating supersonic, if supersonic of, for example, 25 kHz, 600 W is irradiated, energy of supersonic is effectively transmitted to each solar battery 10 and the first substrate 21 so that atoms of silicon in the porous layer 32 are cut. As a result, tensile strength of the isolation layer 32a is remarkably decreased.

Figure 4B:
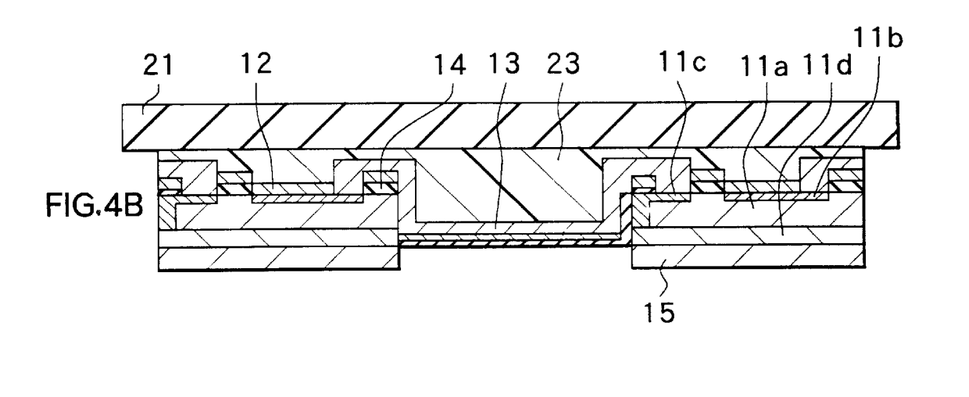

After transcribing each of the solar batteries 10 onto the first substrate 21, as shown in FIG. 4B, the porous layer 32 remained on the other side of each $p^+$-type region 11d is removed using alkaline etching liquid such as potassium hydroxide. Thereby, each of the neighboring solar batteries 10 which is short-circuited by the porous layer 32 is completely isolated. Then, each reverse-side electrode 15 made of aluminum is formed on the other side of each $p^+$-type region 11d by, for example, printing method.

At last, a second substrate 22 made of a material which includes cellulose as the main component is adhered onto each solar battery 10 on the opposite side (that is, the other side) of the first substrate 21 with a contact layer 24 in between. Thereby, a semiconductor device shown in FIG. 1 is completed.

The provisional substrate 31 after the solar batteries 10 are exfoliated can be reused in the next step of forming solar batteries provided that the porous layer 32 which is remained on the surface is removed by etching.

The semiconductor device manufactured as described operates as follows.

In the semiconductor device, if light is irradiated, part of light permeates through the first substrate 21 into each solar battery 10 and is absorbed. In each $n^+$-type region 11b and each p-type region 11a in which light is absorbed, an electron-hole is generated. The electron generated in each of the p-type regions 11a is pulled by electric field and moves into each of the $n^+$-type regions 11b, and the hole generated in each of the $n^+$-type regions 11b is pulled by electric field and moves into each of the p-type regions 11a. Thereby, electric current proportional to the amount of irradiation light is generated.

In the semiconductor device, the first substrate 21 is made of a material which includes cellulose as the main component so that irradiation of light into each of the solar batteries 10 is secured. Especially, if the first substrate 21 is transparent or semitransparent, sufficient amount of irradiation light is obtained.

Furthermore, the first substrate 21 and the second substrate 22 are made of a material which includes cellulose as the main component, respectively, so that the difference in coefficient of thermal expansion between the first substrate 21, the second substrate 22 and each solar battery 10 can be decreased and warp caused by changes in the temperature can be suppressed. As a result, breakdown of each solar battery 10 can be suppressed.

According to the example, the difference in coefficient of thermal expansion between the first substrate 21, the second substrate 22 and each solar battery 10 can be decreased and warp caused by changes in the temperature can be suppressed since the first substrate 21 and the second substrate 22 are made of a material which include cellulose as the main component, respectively. As a result, breakdown of each solar battery 10 can be suppressed.

In addition, the semiconductor device can be lightened and the cost can be decreased while processing such as folding, bending, adhering or cutting can be easily performed. Therefore, its usage can be largely expanded to a case where, for example, the semiconductor device is built-in as the electric source of a watch.

Furthermore, it can be spontaneously decomposed so that the cost needed for disposing can be decreased. Also, a toxic environmental hormone does not generate so that the environment can be protected. In addition, illustrations or letters can be drawn on the surfaces of the first substrate 21 and the second substrate 22. Therefore, the appearance when it is in use can be improved adding to its value.

Moreover, if the first substrate 21 is transparent or semitransparent, the amount of light irradiated into each of the solar batteries 10 can be increased and the efficiency can be improved. In addition, if the second substrate 22 is opaque, light passed through each solar battery 10 can be reflected so that the amount of light irradiated into each solar battery 10 can be increased. As a result, efficiency of each solar battery 10 can be improved.

SECOND EXAMPLE

Figure 5:
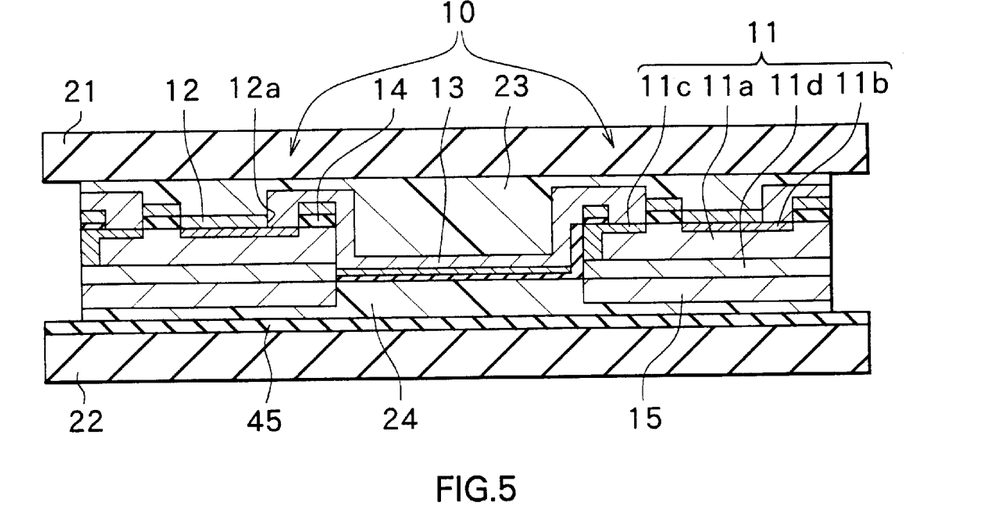
FIG. 5 is a cross section showing the configuration of a semiconductor device according to a second example of the invention.

FIG. 5 shows the configuration of a semiconductor device according to a second example of the invention. The semiconductor device has the identical configuration, operation and effects to those of the first example except that it comprises a reflection film 45. Also, it can be formed like the first embodiment. Hence, like elements are given like numerals and the detailed description of them will be omitted.

The reflection film 45 is made of titanium oxide and is formed on the second substrate 22 on the solar batteries 10 side. The reflection film 45 is for increasing the amount of light irradiated into each solar battery 10 by reflecting the light passed through each solar battery 10. At this time, although the reflection film 45 is formed on the second substrate 22 on the solar batteries 10 side, it may be formed on the second substrate 22 on the opposite side of the solar batteries 10. Also, although the reflection film 45 is formed all over the surface, it may be formed on part of the surface. Incidentally, if the reflection film 45 is provided, the second substrate 22 does not required to be opaque, unlike the first example. The reflection film 45 can be formed by applying the powder of titanium oxide onto the surface of the second substrate 22.

According to the example, the light passed through each of the solar batteries 10 can be reflected since the reflection film 45 is included. As a result, the amount of light irradiated into each solar battery 10 can be increased. Therefore, efficiency of each solar battery 10 can be improved.

THIRD EXAMPLE

Figure 6:
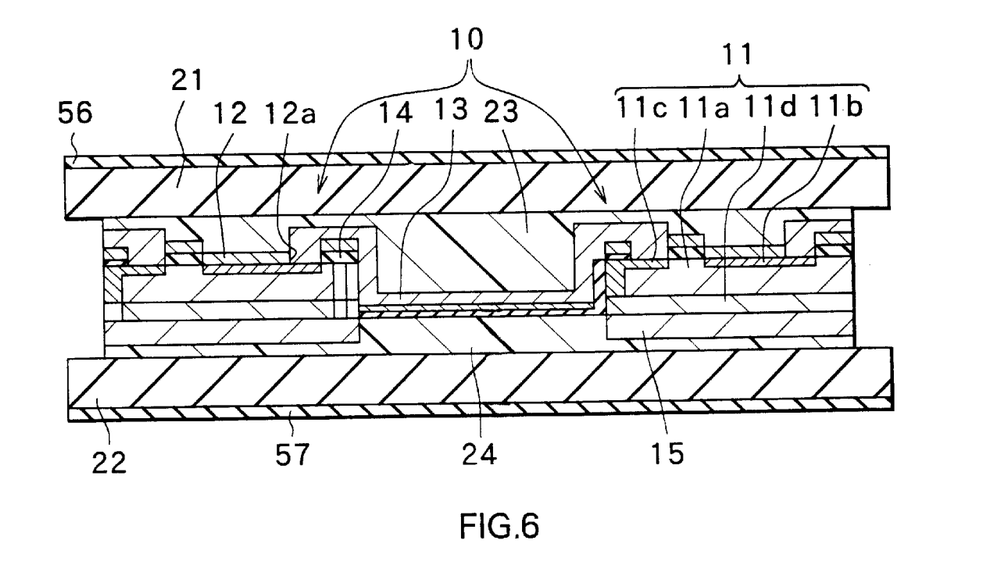
FIG. 6 is a cross section showing the configuration of a semiconductor device according to a third example of the invention.

FIG. 6 shows the configuration of a semiconductor device according to a third example of the invention. The semiconductor device has the identical configuration, operation and effects to those of the first example except that it comprises waterproof films 56 and 57. Also, it can be formed in the same manner as in the first example. Therefore, like elements are given like numerals and the detailed description of them will be omitted.

The waterproof film 56 is formed, for example, on the first substrate 21 on the opposite side of the solar batteries 10, and the waterproof film 57 is formed, for example, on the second substrate 22 on the opposite side of the solar batteries 10. The waterproof films 56 and 57 have a thickness of 20 μm, for example, and it is preferable that they are formed of resin film, respectively. As resin used for the resin film, for example, the following will be suitable: polyolefin resin; polyester resin; melamine resin; silicon resin; or biodegradable resin such as polylactic acid. The waterproof films 56 and 57 are for preventing the first substrate 21 and the second substrate 22 from absorbing water and swelling.

At this time, the waterproof film 56 is formed on the first substrate 21 on the opposite side of the solar batteries 10 and the waterproof film 57 is formed on the second substrate 22 on the opposite side of the solar batteries 10. However, the waterproof film 56 may be formed on both sides of the first substrate 21 and the waterproof film 57 may be formed on both sides of the second substrate 22. In addition, although each of the waterproof films 56 and 57 are formed all over each of the first substrate 21 and the second substrate 22 at this time, they may be formed on a part of those surfaces.

If necessary, a waterproof film made of resin may be formed on at least a part of the end face of the first substrate 21 and the second substrate 22 in order to prevent the first substrate 21 and the second substrate 22 from being impregnated with water. In addition, if necessary, a waterproof film such as a resin may be added to at least a part of the first substrate 21 and the second substrate 22. As a resin composing the waterproof film or the waterproof substance, the followings are used: emulsion such as polyolefin or synthetic rubber; polyester resin; melamine resin; silicon resin; or biodegradable resin. Especially, it is preferable that the resin having about the same index of refraction as cellulose is used when the first substrate 21 is impregnated with a resin so that the first substrate 21 can be made more transparent.

According to the example, the first substrate 21 and the second substrate 22 can be prevented from absorbing water and swelling since the waterproof films 56 and 57 are included in the device. As a result, breakdown of the solar batteries 10 by swelling can be suppressed.

Although the invention has been described by referring to each of the examples, it is not limited to the above-mentioned examples but various modifications can be applicable. For example, although a case where the first substrate 21 and the second substrate 22 are formed of at least either paper or non-woven cloth has been described in the above-mentioned examples, they may be formed of a material in which paper and non-woven cloth are laminated. Also, they may be formed of a material in which a plurality of papers are laminated. In this case, it is preferable that papers are laminated by making the flow direction of the fiber of cellulose generated at the time of making papers parallel or orthogonal.

Furthermore, although a case where the whole first substrate 21 is transparent or semitransparent has been described in the above-mentioned examples, only a part of it corresponding to each of the solar batteries 10 may be transparent or semitransparent. Also, if the first substrate 21 is formed of paper or non-woven cloth including oil, only a part of the first substrate 21 corresponding to each of the solar batteries 10 may be formed by that material.

In addition, although a case where the whole second substrate 22 is opaque has been described in the above-mentioned examples, only a part of it corresponding to each of the solar batteries 10 may be opaque.

Furthermore, although a case where the semiconductor layer 11 is formed of single crystalline silicon has been described in the above-mentioned examples, it may be formed of polycrystalline silicon, amorphous silicon, the complex of both or a composite layer of both. In addition, in the above-mentioned examples, although the configuration of each solar battery 10 is described by referring to a specific example, the invention is broadly applied to a semiconductor device comprising solar batteries having another configuration.

Moreover, a case where the semiconductor device comprises solar batteries 10 as thin film semiconductor layers has been described in the above-mentioned examples. However, the invention is broadly applied to a case where the semiconductor device comprises other thin film semiconductor layers such as other light-absorbing element or emission element, liquid crystal display, or integrated circuit element.

As described, a semiconductor device of the invention comprises a first substrate made of a material including cellulose. As a result, the difference in thermal expansion of the first substrate and thin film semiconductor layers can be decreased and warp caused by changes in the temperature can be suppressed. Therefore, breakdown of the thin film semiconductor layers can be suppressed.

Furthermore, the semiconductor device can be lightened and the cost can be decreased while processing such as folding, bending, adhering or cutting can be easily performed. Also, it can be spontaneously decomposed so that the cost needed for disposing can be decreased. Also, a toxic environmental hormone does not generate so that the environment can be protected.

Especially, if solar batteries are included as the thin film semiconductor layers, the amount of light irradiated into each of the thin film semiconductor layers can be increased and the efficiency can be improved since the first substrate is formed to be transparent or semitransparent.

In addition, by drawing illustrations on at least a part of the first substrate 21, the appearance can be improved adding to its value when it is in use.

Furthermore, the first substrate and the second substrate can be prevented from absorbing water and swelling by comprising a waterproof film or including a waterproof substance. As a result, breakdown of the thin film semiconductor layers by swelling can be suppressed.

Moreover, by comprising a second substrate made of a material including cellulose, same effect as comprising the first substrate made of a material including cellulose can be obtained.

In addition, the light passed though the thin film semiconductor layers can be reflected, and the amount of the light irradiated into the thin film semiconductor layers can be increased in a case where the solar batteries are included as the thin film semiconductor layers by making the second substrate opaque or comprise a reflection film. As a result, efficiency can be increased.

Moreover, according to a method of manufacturing a semiconductor device of the invention, the semiconductor device of the invention can be easily manufactured since the thin film semiconductor layers are exfoliated from the provisional substrate and are transcribed onto the first substrate made of a material including cellulose.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device, the method comprising the steps of:
   depositing thin film semiconductor layers on a provisional substrate;
   exfoliating the thin film semiconductor layers from the provisional substrate;
   transcribing the exfoliated thin film semiconductor layers onto a first substrate made of a material including cellulose; and
   after the thin film semiconductor layers are exfoliated from the provisional substrate, positioning a second substrate made of a material including cellulose on a side of the thin film semiconductor layers opposite to the first substrate.

2. A method of manufacturing a thin film semiconductor device according to claim 1 wherein the thin film semiconductor layers are transcribed onto the first substrate on a part of a surface of the first substrate on which a waterproof film is deposited.

3. A method of manufacturing a thin film semiconductor device according to claim 1 wherein the thin film semiconductor layers are deposited on the provisional substrate with a porous layer in between.

4. A method of manufacturing a thin film semiconductor according to claim 3 wherein the porous layer is formed by anodizing.

5. A method of manufacturing a thin film semiconductor device according to claim 3 wherein after the first substrate is adhered on the thin film semiconductor layers, the thin film semiconductor layers are exfoliated from the provisional substrate by at least one of means of exposing the thin film semiconductor layers deposited on the first substrate to supersonic, applying force to pull the thin film semiconductor layers and the first substrate apart, and centrifugal separation.

6. A method of manufacturing a thin film semiconductor device according to claim 3 wherein after the thin film semiconductor layers are exfoliated from the provisional substrate made of single crystalline or polycrystalline semiconductor material, the provisional substrate is reused in a process of manufacturing further thin film semiconductor layers by removing a remainder of the porous layer.

7. A method of manufacturing a semiconductor device according to claim 1 wherein after the thin film semiconductor layers are deposited on more than one regions, the regions are separated each other and then the thin film semiconductor layers of each region are transcribed onto the first substrate.

8. A method of manufacturing a thin film semiconductor device according to claim 1 wherein a reflecting film is deposited on at least a part of a surface of the second substrate.

9. A method of manufacturing a semiconductor device according to claim 1 wherein at least a part of a surface of the second substrate is covered with a waterproof film.

10. The method of manufacturing a thin film semiconductor device according to claim 1, wherein after the thin film semiconductor layers are transcribed onto the first substrate, the thin film semiconductor layers are exfoliated from the provisional substrate by at least one of soaking the provisional substrate in one of water or solution and exposing the thin film semiconductor layers deposited on the first substrate to supersonic energy, applying force to pull the thin film semiconductor layers and the first substrate apart from the provisional substrate, and centrifugal separation.

11. A method of manufacturing a semiconductor device, the method comprising the steps of:

depositing thin film semiconductor layers on a provisional substrate;

exfoliating the thin film semiconductor layers from the provisional substrate;

transcribing the exfoliated thin film semiconductor layers onto a first substrate made of a material including cellulose; and after the thin film semiconductor layers are exfoliated from the provisional substrate, positioning a second substrate made of a material including cellulose on a side of the thin film semiconductor layers opposite to the first substrate, wherein at least a part of the first substrate includes oil.

12. A method of manufacturing a thin film semiconductor device according to claim 11, wherein the thin film semiconductor layers are transcribed onto the first substrate on a part of the surface of which a waterproof film is deposited.

13. A method of manufacturing a thin film semiconductor device according to claim 11, wherein the thin film semiconductor layers are deposited on the provisional substrate with a porous layer in between.

14. A method of manufacturing a thin film semiconductor device according to claim 13, wherein the porous layer is formed by anodizing.

15. The method of manufacturing a thin film semiconductor device according to claim 13, wherein after the thin film semiconductor layers are transcribed onto the first substrate, the thin film semiconductor layers are exfoliated from the provisional substrate by at least one of soaking the provisional substrate in one of water or solution and exposing the thin film semiconductor layers deposited on the first substrate to supersonic energy, applying force to pull the thin film semiconductor layers and the first substrate apart from the provisional substrate, and centrifugal separation.

16. A method of manufacturing a thin film semiconductor device according to claim 13, wherein after the thin film semiconductor layers are exfoliated from the provisional substrate, which is made of a single crystalline or polycrystalline semiconductor material, the provisional substrate is reused in a process of manufacturing following thin film semiconductor layers by removing a remains of the porous layer.

17. A method of manufacturing a semiconductor device according to claim 11, wherein after the thin film semiconductor layers are deposited on more than one region of the provisional substrate, the regions are separated from each other and then the thin film semiconductor layers of each region are transcribed onto the first substrate.

18. A method of manufacturing a thin film semiconductor device according to claim 11, wherein a reflecting film is deposited on at least a part of a surface of the second substrate.

19. A method of manufacturing a thin film semiconductor device according to claim 11, wherein at least a part of a surface of the second substrate is covered with a waterproof film.

* * * * *